(12) United States Patent
Yun et al.

(10) Patent No.: US 6,587,976 B1
(45) Date of Patent: Jul. 1, 2003

(54) SEMICONDUCTOR DEVICE TESTER FOR MEASURING SKEW BETWEEN OUTPUT PINS OF A SEMICONDUCTOR DEVICE

(75) Inventors: Jin-Mo Yun, Kyungki-do (KR); Byung-Se So, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/454,339

(22) Filed: Dec. 3, 1999

(30) Foreign Application Priority Data

Dec. 8, 1998 (KR) ............................................ 98-53644

(51) Int. Cl.[7] ...................... G06K 5/04; G01R 31/28; G01R 29/00
(52) U.S. Cl. ..................... 714/700; 714/736; 714/744; 324/158.1; 327/12
(58) Field of Search ................................ 714/700, 736, 714/738, 744, 819, 55, 731, 814; 327/12, 39, 40, 250, 294, 295, 296; 324/76.82, 158.1, 765; 713/503

(56) References Cited

U.S. PATENT DOCUMENTS

| | | | |
|---|---|---|---|
| 4,646,297 A | * 2/1987 | Palmquist et al. | ............. 327/12 |
| 5,231,598 A | * 7/1993 | Vlahos | ........................ 714/700 |
| 5,436,908 A | * 7/1995 | Fluker et al. | ................ 714/700 |
| 5,578,938 A | * 11/1996 | Kazami | ......................... 326/16 |
| 5,894,226 A | * 4/1999 | Koyama | .................. 324/158.1 |
| 5,991,890 A | * 11/1999 | Brown et al. | ................ 702/117 |
| 6,016,566 A | * 1/2000 | Yoshida | ....................... 714/736 |

* cited by examiner

*Primary Examiner*—Albert Decady
*Assistant Examiner*—Matthew C. Dooley
(74) *Attorney, Agent, or Firm*—Myers Bigel Sibley & Sajovec (57) ABSTRACT

Semiconductor device testers are provided which measure skew between two or more output pins of a semiconductor device independent of a strobe timing input. More particularly, a skew signal is generated by a comparator circuit that changes state when the respective outputs transition state, for example, from matching to differing states. In a two output pin embodiment, for instance, when one of the output pin changes state before the other and both initially are in the same state, a flip flop is set at the time when the data on the output pins first differs, i.e. when the first output pin transitions to a new state. The flip flop is then reset when the second output pin subsequently transitions to the new state and again matches the first output pin. The resulting duration of the output of the flip flop thereby corresponds to the time of skew of the output pins regardless of the initial state of the pins.

15 Claims, 7 Drawing Sheets

Fig. 1

PRIOR ART

SEMICONDUCTOR DEVICE TESTER FOR MEASURING SKEW BETWEEN OUTPUT PINS OF A SEMICONDUCTOR DEVICE

FIELD OF THE INVENTION

The present invention relates to semiconductor device testers.

RELATED APPLICATIONS

This application is related to Korean Application No. 98-53644, filed Dec. 8, 1998, the disclosure of which is hereby incorporated herein by reference.

BACKGROUND OF THE INVENTION

Various complex semiconductor devices, such as integrated circuit packages with a number of input/output pins, are commonly manufactured and utilized in a variety of areas. It is often desirable to test such devices after their manufacture to verify their performance. To facilitate testing of such integrated semiconductor devices a variety of semiconductor device tester designs have been provided. Such conventional testers typically provide for detecting transitions of output data at a specific pin during a test of a semiconductor device and further to detect a data output speed or rate for a specific pin. Generally, however, such conventional testers do not provide for a measurement of comparative data streams between different input/output pins of the semiconductor device. Accordingly, such devices typically are not able to measure the skew, or response time difference, between data output from respective data input/output pins of a semiconductor device. This limitation is becoming problematic as semiconductor device designers work to reduce such skew in light of the ever increasing speed of operations of various semiconductor devices. As the semiconductor devices migrate to ever higher operating speeds, the likelihood of errors being generated as a result of skew between output data increases.

One type of prior art semiconductor tester device attempts to use a data strobe in the semiconductor device tester. Nonetheless, a problem may still exist using this approach in that expected values generated by the tester and the actual output data from the semiconductor device being tested are generally compared only to detect transitions of output data at a point and time specified by the strobe which is not suitable for determining the skew between the output of two data input/output pins of the semiconductor device.

Figure 1:
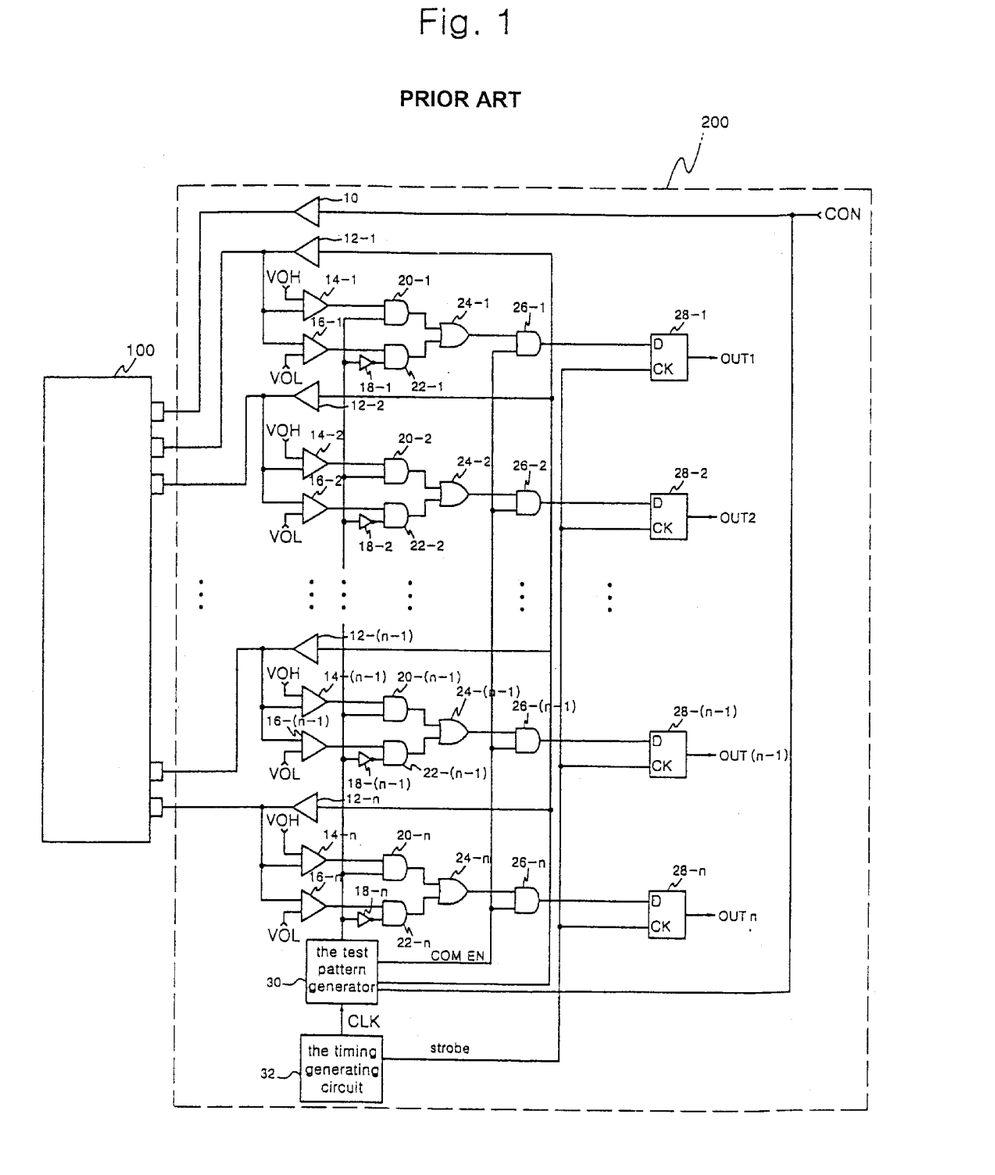
FIG. 1 is a schematic block diagram illustration of a semiconductor device tester according to the prior art.

An example of such a prior are semiconductor device tester will now be further described with reference to the schematic block diagram of FIG.1. As shown in FIG.1, the semiconductor device 100 is electrically coupled to a tester 200. The semiconductor device 100 includes control signal input pins and data input/output pins which are coupled to the tester 200. The tester 200 includes a control signal input driver 10, data input drivers 12-1, 12-2, . . . , 12-n, amplifier gates 14-1, 14-2, . . . , 14-n, 16-1, 16-2, . . . , 16-n, inverters 18-1, 18-2, . . . , 18-n, AND gates 20-1, 20-2, . . . , 20-n, 22-1, 22-2, . . . , 22-n, 26-1, 26-2, . . . , 26-n, OR gates 241, 242, . . . , 24-n, D flip flops 28-1, 28-2, . . . , 28-n, a test pattern generator circuit 30 and a timing generator circuit 32.

The embodiment illustrated in FIG.1 represents a tester for use where the data input/output pins of the semiconductor device 100 are common. When the data input and data output pins of the semiconductor device 100 are separate pins, it is to be understood by those of ordinary skill in the art that the data input drivers are connected to data input pins 12 while the amplifier gates 14 are connected to data output pins.

Operations of the prior art semiconductor device tester will now be further described with reference to FIG.1. The tester 200 sends a control signal CON to a control signal input pin of the semiconductor device 100 through the control signal input driver amplifier 10 and further sends the control signal CON to the test pattern generator 30. The test pattern reference data output from the test pattern generator 30 is then input to the semiconductor device 100 via the data input drivers 12-1, 12-2, . . . , 12-n connected to respective data input/output pins of the semiconductor device 100. The semiconductor device 100 further outputs data corresponding to the input reference data test pattern on receipt of a control signal from the input driver 10 while the test pattern generator 30 outputs the reference data (or expected values). The respective amplifier gates 14-1, 14-2, . . . , 14-n in turn generate active signals when the voltage which is output through the corresponding input/output pins is higher than the high reference voltage (VOH). The amplifier gates 16-1, 16-2, . . . , 16-n respectively generate active signals when voltages output through the corresponding input/output pins are lower than the low voltage reference signal (VOL).

As used for purposes of the description herein an "active" state will be used interchangeably with a "high" or "set" state. Similarly, an "inactive" state will be used interchangeably with a "low" or "reset" state. However, it is to be understood that the present invention may equally be applied in circuits using what is commonly referred to as negative or inverse logic with the necessary changes to embodiments described herein being readily known to those of ordinary skill in the art.

As can be seen from the schematic block diagram of FIG.1, the AND gates 20-1, 20-2, . . . , 20-n respectively perform logical multiplications of the output signals of the corresponding amplifier gates 141, 14-2, . . . , 14-n and non-inverted levels output from the test pattern generator 30, thereby generating high (active) signals when both inputs are at high levels. Similarly, the AND gates 22-1, 22-2, . . . , 22-n respectively perform logical multiplications on output signals from corresponding amplifier gates 16-1, 16-2, . . . , 16-n and signals from the test pattern generator 30 inverted by the inverters 18-1, 18-22, . . . , 18-n to thereby generate high level output signals when the signal from the test pattern generator 30 and the respective output pin of the semiconductor device 100 are both at a low level. Accordingly, the AND gates 20-1, 20-2, . . . , 20-n detect values of high levels output from corresponding data input/output pins of the semiconductor device 100 while the AND gates 22-1, 22-2, . . . , 22-n respectively detect values of low levels output from associated ones of the data input/output pins of the semiconductor device 100. As a result, the OR gates 24-1, 24-2, 24-n respectively generate high level signals when matched values of high levels are detected by the AND gates 20-1, 20-2, . . . , 20-n and when low level values are detected by the AND gates 22-1, 22-2, . . . , 22-n.

When the output signal of the OR gates 24-1, 24-2, . . . , 24n are at low levels, they are judged to be inferior and at high levels, they are judged to be normal. The AND gates 26-1, 26-2, . . . , 26-n, in turn, respectively perform logical multiplications on the signals COM EN generated by the test pattern generator 30 and the output signals from the OR gates 24-1, 24-2, . . . , 24-n to thereby generate a high or low level signal output. Finally, the D flip flops 28-1, 28-2, . . . , 28-n, responsive to strobe signals generated by the timing generator circuit 32, generate output signals of the AND gates 26-1, 26-2, . . . , 26-n as the output signals OUT 1, OUT 2, . . . , OUT n respectively. In other words, the tester 200 generates output signals for the respective corresponding input/output pins of the semiconductor device 100 with reference to the high and low level voltage reference values VOH, VOL respectively at times defined by the strobe signal to discriminate whether there has been a state transition on the input/output pins at the time of the strobe signal.

This prior art semiconductor device tester design has various problems. The tester only determines whether there has been a transition of output data at a strobe signal controlled time interval. The tester does not provide for measurements of relative transition times (or skew) between two different input/output lines of the semiconductor device 100. Accordingly, there is a need for improved semiconductor device testers.

SUMMARY OF THE INVENTION

It is, therefore, an object of the present invention to provide semiconductor device testers that may measure skew between output pins of a semiconductor device.

In order to provide for the foregoing and other objectives, semiconductor device testers are provided which measure skew between two or more output pins of a semiconductor device independent of a strobe timing input. More particularly, a skew signal is generated by a comparator circuit that changes state when the respective outputs transition state, for example, from matching to differing states. In a two output pin embodiment, for instance, when one of the output pin changes state before the other and both initially are in the same state, a flip flop is set at the time when the data on the output pins first differs, i.e. when the first output pin transitions to a new state. The flip flop is then reset when the second output pin subsequently transitions to the new state and again matches the first output pin. The resulting duration of the output of the flip flop thereby corresponds to the time of skew of the output pins regardless of the initial state of the pins although the relevant duration may be during either one of the active or inactive state depending on whether the state of the two output pins initially matches or differs.

In one embodiment of the present invention, a semiconductor device tester is provided having an interface that couples the semiconductor device tester to a plurality of output pins of a semiconductor device. A comparator circuit electrically couples to at least two of the plurality of output pins of the semiconductor device and generates a skew signal having a duration corresponding to a time period when data on the at least two of the plurality of output pins differs. A timing circuit may be electrically coupled to the skew signal that measures the duration of the skew signal. The comparator circuit includes a first circuit that generates an active signal when the data on the at least two of the plurality of output pins differs and an inactive signal when the data on the at least two of the plurality of output pins matches. The comparator circuit further includes a second circuit that generates an active signal when the data on the at least two of the plurality of output pins matches and an inactive signal when the data on the at least two of the plurality of output pins differs. A flip flop has a set input electrically coupled to the first circuit and a reset input electrically coupled to the second circuit and outputs the skew signal.

A plurality of comparator circuits may be included in the tester each having as inputs at least two of the output pins of the semiconductor device. The flip flops may be SR flip flops. The first circuit may be a logical exclusive OR circuit and the second circuit may be a logical exclusive NOR circuit.

In another embodiment, the logical exclusive OR circuit includes at least a selected number of exclusive OR gates, the selected number of exclusive OR gates being selected based on a number of the at least two of the plurality of output pins. The logical exclusive NOR circuit includes at least a selected number of exclusive NOR gates, the selected number of exclusive NOR gates being the same as the selected number of exclusive OR gates. The number of the at least two of the plurality of output pins may be three and the selected number of exclusive OR gates may be two.

In a further embodiment of the present invention, the semiconductor device tester includes a control signal input driver circuit electrically coupled to the semiconductor device. A test pattern generator circuit generates reference data responsive to the control signal input driver circuit. A timing generator circuit generates a strobe. A signal detection circuit electrically coupled to the test pattern generator circuit and the at least two of the plurality of output pins of the semiconductor device detects when a transition has occurred on one of the at least two of the plurality of output pins responsive to the strobe.

In another embodiment of the present invention, the timing circuit is configured to measure a time between a first edge of the skew signal and a second edge of the skew signal. The timing circuit may be configured to measure a time from an enable signal input to the first flip flop to a disable signal input to the first flip flop and to measure a time from an enable signal input to the second flip flop to a disable signal input to the second flip flop.

In yet another embodiment of the present invention, a semiconductor device tester is provided that includes a predetermined number of first circuits that generate an active signal when data on selected ones of a plurality of output pins of a semiconductor device differs and an inactive signal when the data on the selected ones of the plurality of output pins matches. A predetermined number of second circuits, each of the second circuits being associated with one of the first circuits, generate an active signal when the data on the selected ones of the plurality of output pins matches and an inactive signal when the data on the selected ones of the plurality of output pins differs. A predetermined number of flip flops, each of the flip flops having a set input electrically coupled to an associated one of the first circuits and a reset input electrically coupled to one of the second circuits associated with the associated one of the first circuits, each output a skew signal having a duration corresponding to a time period when data on the associated selected ones of the plurality of output pins differs.

In another embodiment of the present invention, a semiconductor device tester is provided having first signal generating means for generating on an output of the first signal generating means an active signal when data on two output pins of a semiconductor device differs and an inactive signal when the data matches and second signal generating means for generating on an output of the second signal generating means an active signal when the data matches and an inactive signal when the data differs. The tester further includes third signal generating means for generating a skew signal corresponding to a time period when the data on the two output pins differs, the third signal generating means being set responsive to the output of the first signal generating means and reset responsive to the output of the second signal generating means.

In another aspect of the present a method is provided in a semiconductor device tester for detecting timing skew between first and second signals on first and second signal lines. The method includes performing a boolean exclusive OR operation on the first and second signals and generating therefrom a skew signal having a duration corresponding to a degree of timing skew between the first and second signals.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by one of skill in the art, the present invention may be embodied as methods or devices. Like numbers refer to like elements throughout and signal lines and signals thereon may be referred to by the same reference symbols.

Figure 2:
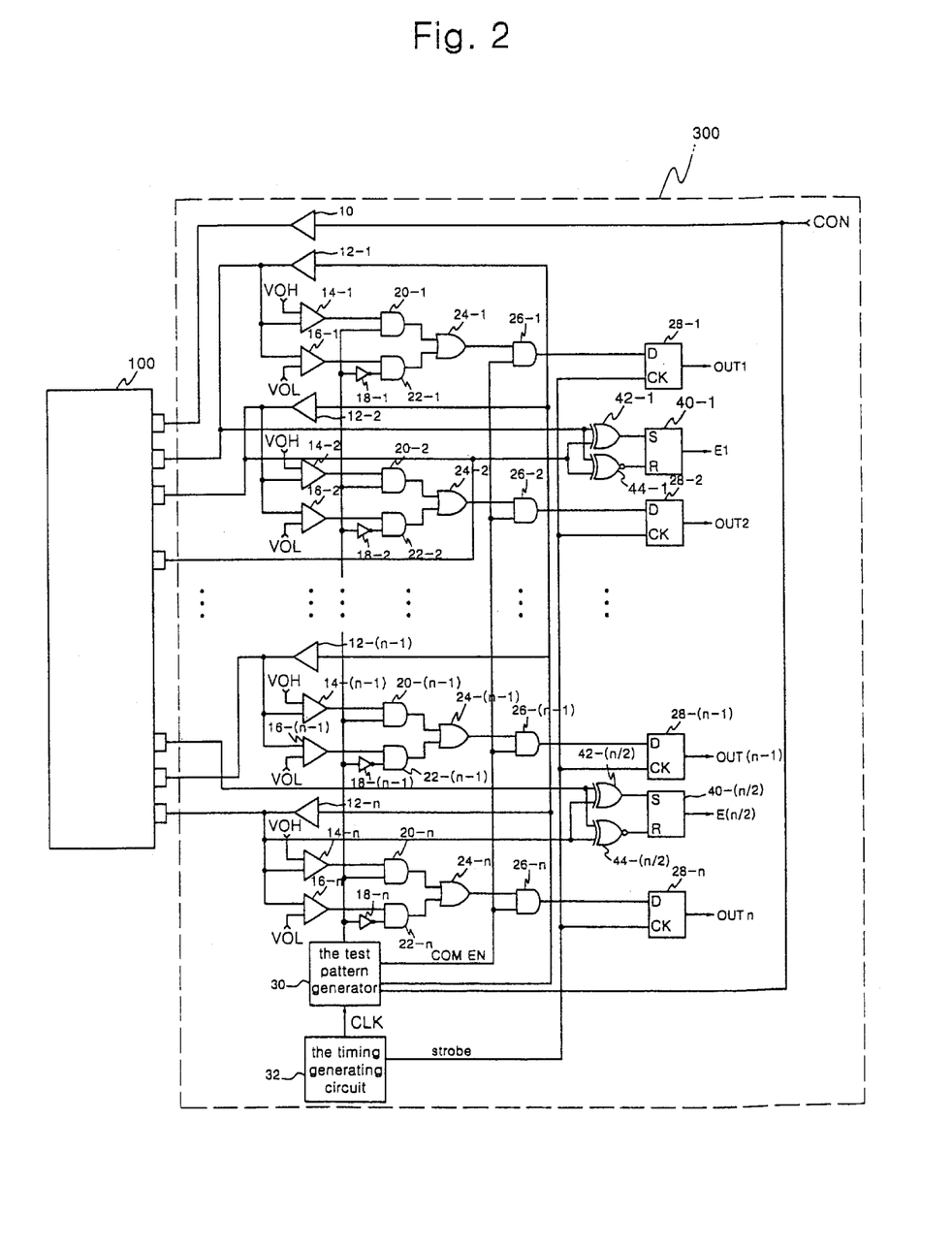
FIG. 2 is a schematic block diagram illustration of a semiconductor device tester according to an embodiment of the present invention.

The present invention will now be further described with reference to the schematic block diagram of an embodiment of a semiconductor device tester illustrated in FIG. 2. As shown in FIG. 2, a tester 300 is interfaced to a plurality of input/output pins of the semiconductor device 100. As used herein, in the interests of clarity, the terms input/output and output will be used interchangeably as it will be understood by one of skill in the relevant art that the present invention may be applied to semiconductor devices having common or separate input and output pins. The illustrated tester 300 includes various circuits previously described with reference to the tester 200 shown in FIG. 1 which will not be further described herein. In addition, the tester 300 includes a comparator circuit coupled to the plurality of output pins of the semiconductor device 100 that generates a skew signal having a duration between state transitions corresponding to a time period when data on respective ones (pairs in the embodiment of FIG. 2) of the output pins differs. The comparator circuit includes exclusive OR (XOR) gates 42-1, 42-2, . . . , 42-(n/2), exclusive NOR (XNOR) gates 44-1, 44-2, . . . , 44-(n/2) (also referred to as equivalence AND gates) and SR flip flops 40-1, 40-2, . . . , 40-(n/2).

The XOR gates 42-1, 42-2, . . . , 42-(n/2) each have an associated XNOR gate 44-1, 44-2, . . . , 44-(n/2) and the XOR and XNOR gates are each respectively coupled to two input/output pins of the semiconductor device 100. The SR flip flops 40-1, 40-2, . . . , 40-(n/2) have S (set) inputs coupled to the output signals of associated ones of the XOR gates 42-1, 42-2, . . . , 42-(n/2) and R (reset) inputs coupled to the output signals of associated ones of the XNOR gates 44-1, 44-2, . . . , 44-(n/2).

Operations of the tester 300 as related to the aspects in common with the tester 200 of FIG. 1 will not be further described herein. Instead, operations for the invention aspects of the present invention will now be further described with reference to the schematic block diagram of FIG. 2 and the timing diagrams of FIGS. 3a–3d. As they relate to measuring a data skew between data input/output pins of a semiconductor device 100. The tester 300 serves to input a control signal CON to the semiconductor device 100 through a control signal input driver 10. Subsequently, the XOR gates 42-1, 42-2, . . . , 42-n respectively receive at their inputs data signals output from the two data input/output pins linked to the respective gates. If the data on the two output pin matches, the XOR gates generate at their output low (inactive) signal levels. If the data differs, the XOR gates generate at their output high (active) signal levels. Similarly, XNOR gates 44-1, 44-2, . . . , 44-n respectively receive at their inputs data signals output from the two data input/output pins linked to the respective gates. If the data on the two output pins differs, the XNOR gates generate at their output low (inactive) signal levels. If the data matches, the XNOR gates generate at their output high (active) signal levels.

The SR flip flops 40-1, 40-2, . . . , 40-n in turn generate high (active) signal levels when the input signals to their S (set) input terminal from the associated XOR gates are high signal levels and the input signals to their R (reset) input terminal from the associated XNOR gates are low signal levels. The SR flip flops 40-1, 40-2, . . . , 40-n generate low (inactive) signal levels when the input signals to their S (set) input terminal from the associated XOR gates are low signal levels and the input signals to their R (reset) input terminal from the associated XNOR gates are high signal levels. Note that, when the signals applied to the S input terminal and R input terminal are all low levels the SR flip flops 40-1, 40-2, . . . , 40-n maintain previous states and, when the signals are all high levels, the SR flip flops 40-1, 40-2, . . . , 40-n may fall into indeterminate states.

Figure 3A:
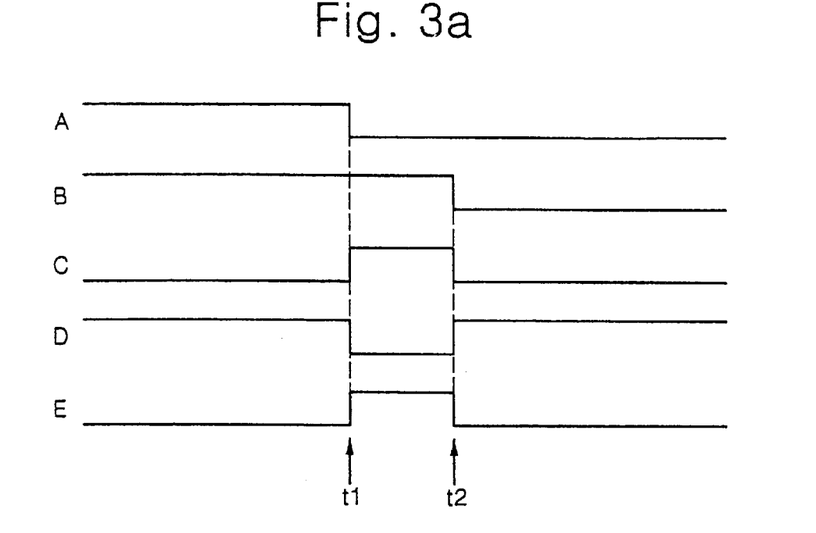
FIGS. 3a, 3b, 3c and 3d are timing diagrams illustrating operations of the semiconductor device tester of FIG. 2.

Operations of the embodiment of a semiconductor device tester illustrated in FIG. 2 will now be further described with reference to the timing diagrams of FIGS. 3a, 3b, 3c and 3d with reference to one of the circuits. However, it is to be understood that the explanation applied herein equally applies to each of the circuits included in the tester 300 to allow testing of all of the input/output pins of the semiconductor device 100. FIG. 3a illustrates operations when the data on the two data input/output pins (A and B respectively in the figures) both transition from high levels to low levels. As shown in FIG. 3a, the timing of the transition is not simultaneous as data A transitions from a high level to a low level some time ($t_1$–$t_2$) before data B transitions from a high level to a low level. Prior to the state transition of data A, the output of the XOR gate is low and the output of the XNOR gate 44-1 is high as the data A and B are high levels up to a time point $t_1$ in turn leaving the output E of the SR flip flop 40-1 at a low level. When data A becomes low, the output C of the XOR gate 42-1 is changed to a high level and the output D of the XNOR gate 44-1 is changed to a low level as the data A and B are respectively low and high through a time $t_2$. As a result, the output E of the SR flip flop 40-1 becomes high. After the time $t_2$, when the data B becomes low, output C of the XOR gate 42-1 is changed to a low level and the output D of the XNOR gate 44-1 is changed to a high level as the data A and B are both at a low level after the time $t_2$. As a result, the output E of the SR flip flop is changed to a low level at time $t_2$.

Figure 3B:
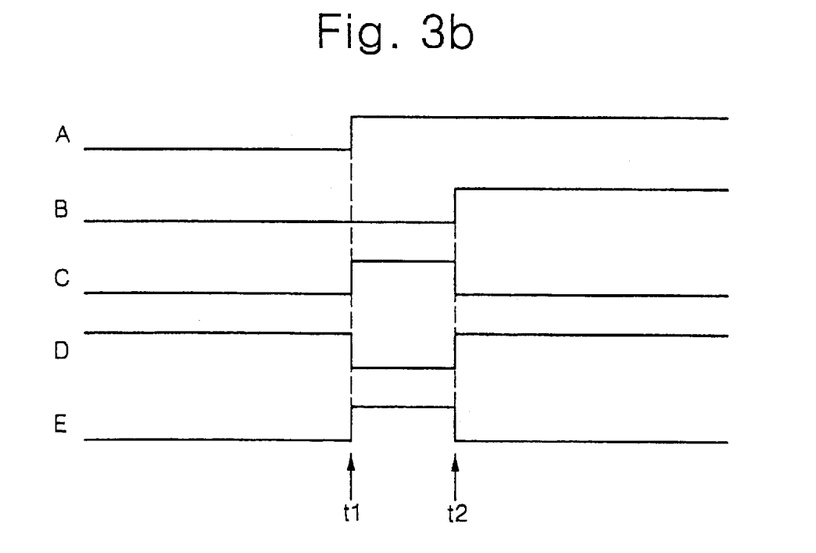

FIG. 3b illustrates output states where the data A and B output from the two data input/output pins are both changed from low levels to high levels with data A again transitioning before data B. Initially, the output C of the XOR gate 42-1 is at a low level and the output D of the XNOR gate 44-1 is at a high level because data A and B are both at a low level up to the time $t_1$. The output E of the SR flip flop 40-1 is therefore at a low level. At time $t_1$ through time $t_2$, the output C of the XOR gate 42-1 becomes a high level and the output D of the XNOR gate 44-1 becomes a low level as data A is high and data B is low. As a result, during this time period, the output E of the SR flip flop 40-1 is at a high level. Finally, at time $t_2$, output C of the XOR gate 42-1 is changed to a low level and the output D of the XNOR gate 44-1 is changed to a high level as data A and B are both at high levels after time $t2_1$. Similarly, the output E of the SR flip flop 40-1 is at a low level after time $t_2$. In other words, as illustrated in FIGS. 3a and 3b, when two output data A and B are changed from the same state, the skew time may be measured between the time when the output E of the SR flip flop 40-1 is set (enabled) and reset (disabled).

Figure 3C:
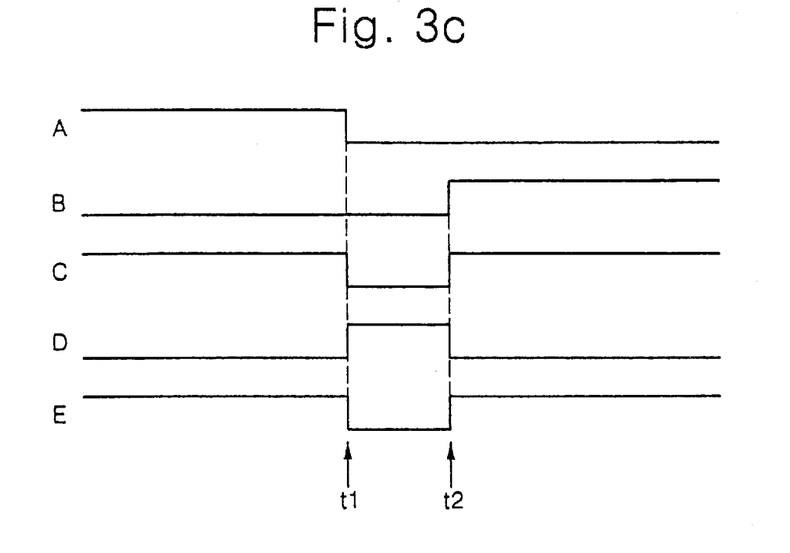

FIG. 3c illustrates output states where the data A and B from the two data input/output pins are respectively changed from a low to a high state (data B) and a high to a low state (data A). Initially, the output C is high, the output D is low and the output E is high. Subsequently, at time $t_1$ when the data A transitions from a high level to a low level some time $(t_2-t_1)$ before the data B is changed from a low level to a high level, the output C becomes low and the output D becomes high thereby driving the output E low until time $t_2$. After time $t_2$, output C becomes high while output D becomes low as the data A remains low while the data B is changed to high. As a result, the output E of the SR flip flop 40-1 becomes high.

Figure 3D:
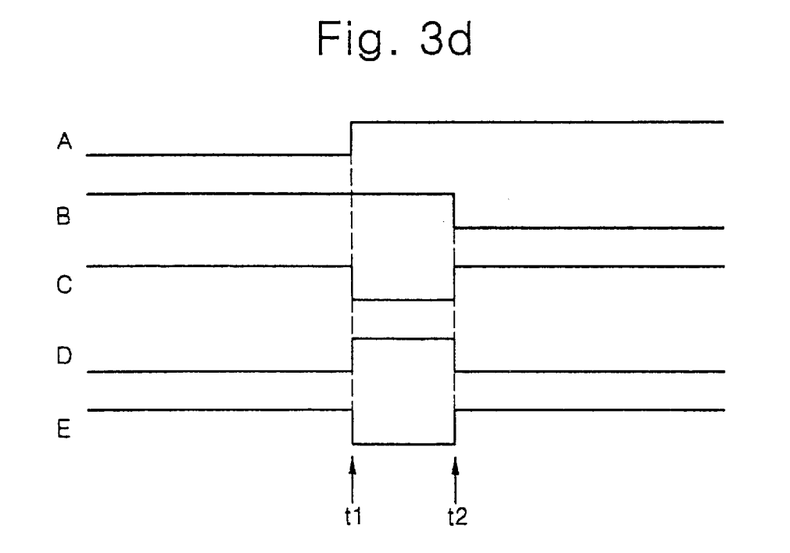

Finally, FIG. 3d illustrates output states where the data A and B from the two data input/output pins are respectively changed from a low to a high state (data A) and a high to a low state (data B). Initially, the output C is high, the output D is low and the output E is high. Subsequently, at time $t_1$ when the data A transitions from a low level to a high level some time $(t_2-t_1)$ before the data B is changed from a high level to a low level, the output C becomes low and the output D becomes high thereby driving the output E low until time $t_2$. After time $t_2$, output C becomes high while output D becomes low as the data A remains high while the data B is changed to low. As a result, the output E of the SR flip flop 40-1 becomes high. In other words, as illustrated in FIGS. 3c and 3d, when two output data A and B change states and both started at different states, skew time is measured from when the output signals E of the SR flip flops 40-1, 402, ..., 40-n are reset (disabled) until they are set (enabled).

Figure 4:
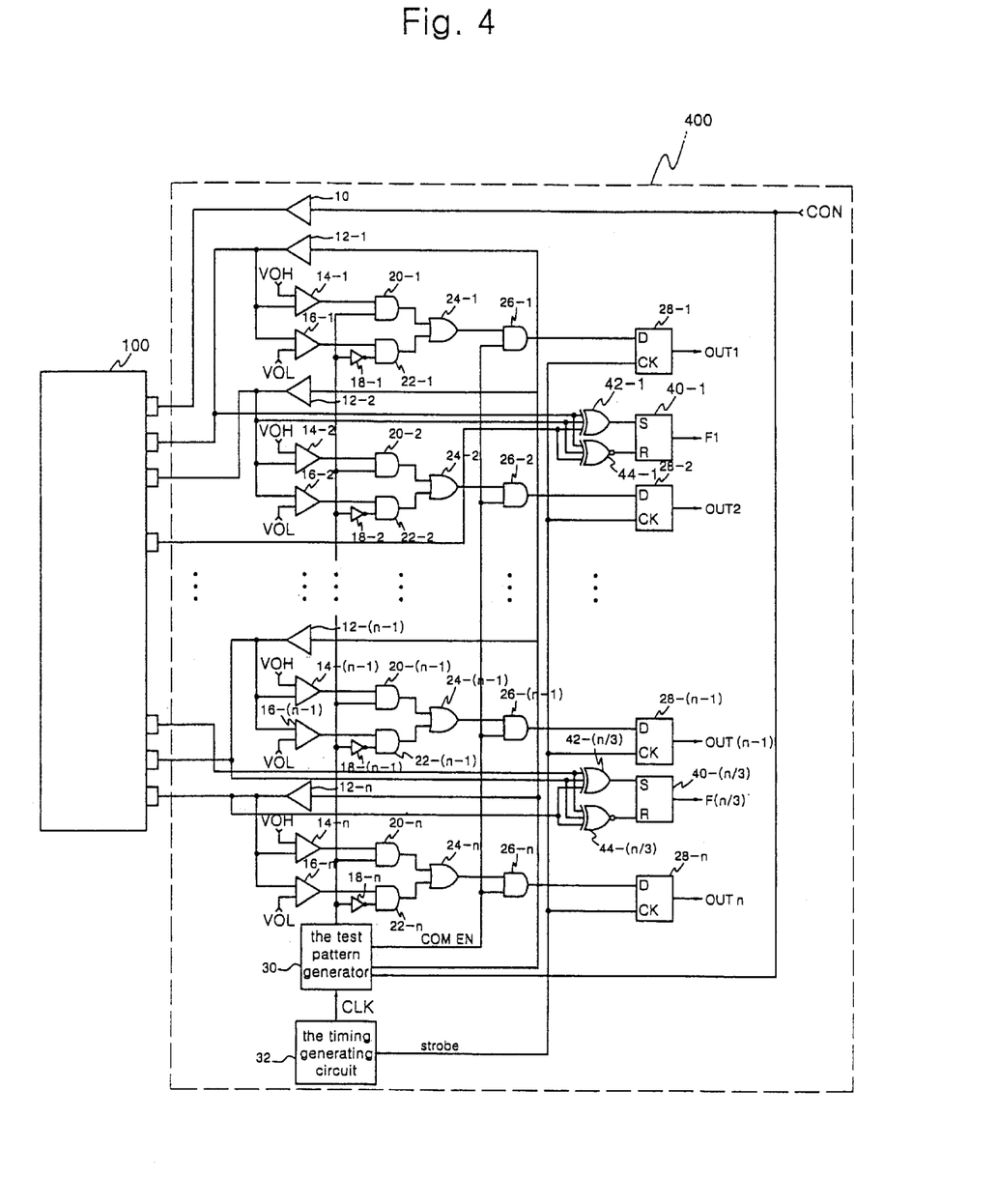
FIG. 4 is a schematic block diagram illustration of a semiconductor device tester according to a further embodiment of the present invention.

A further embodiment of the present invention will now be described with reference to the schematic block diagram of FIG. 4 and the timing diagrams of FIGS. 5a–5d. As shown in FIG. 4, a tester 400 is interfaced to a plurality of input/output pins of the semiconductor device 100. The illustrated tester 400 includes various circuits previously described with reference to the tester 200 shown in FIG. 1 which will not be further described herein. In addition, the tester 400 includes a plurality of comparator circuits coupled to the plurality of output pins of the semiconductor device 100 that generate a skew signal having a duration corresponding to a time period when data on respective ones (three in each grouping in the embodiment of FIG. 4) of the output pins differs. The comparator circuits include exclusive OR (XOR) gates 42-1, 42-2, ..., 42-(n/3), exclusive NOR (XNOR) gates 44-1, 44-2, ..., 44-(n/3) (also referred to as equivalence AND gates), each of which inputs three output data signals from three of the input/output pins of the semiconductor device 100, and SR flip flops 40-1, 40-2, ..., 40-(n/3). SR flip flops 40-1, 40-2, ..., 40-(n/3) have S (set) inputs coupled to the outputs of associated ones of the XOR gates 42-1, 42-2, ..., 42(n/3) and R (reset) inputs coupled to the outputs of associated ones of the XNOR gates 44-1, 44-2, ..., 44-(n/3). Accordingly, the comparator circuits respectively provide for measurement of skews between data output from their associated three data input/output pins of the semiconductor device 100

Figure 5A:
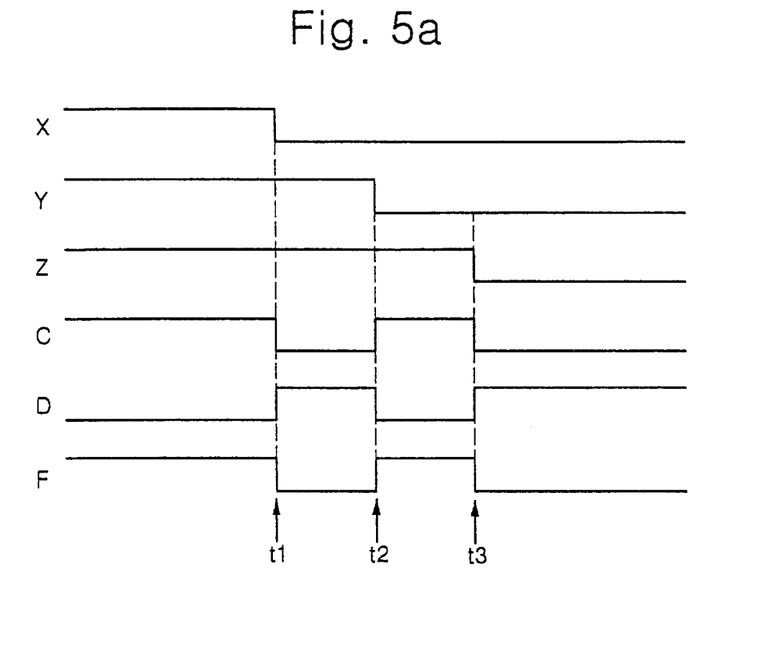
FIGS. 5a, 5b, 5c and 5d are timing diagrams illustrating operations of the semiconductor device tester of FIG. 4.

FIGS. 5a to 5d are timing diagrams illustrating operations for the tester 400 of FIG. 4. FIG. 5a illustrates output signals where the output data signals X, Y and Z are all initially at a high level and transition to a low level. While operations will be described with reference to a single one of the comparator circuits, it is to be understood that the description applies equally to each of the comparator circuits in the tester 400. As shown in FIG. 5a, initially, the output C of the XOR gate 42-1 is high and the output D of the XNOR gate 44-1 is low as the data X, Y and Z are all high up to time $t_1$. As a result, the output F of the SR flip flop 40-1 is initially high. From time $t_1$ to time $t_2$ while the data X is low but Y and Z are high, the output C becomes low and the output D becomes high. Therefore, during this time, the output F is low. From time $t_2$ to time $t_3$ while the data X and Y are low but Z is still high, the output C becomes high and the output D becomes low. Therefore, during this time, the output F is high. Finally, after time $t_3$, data Z also becomes low and output C becomes low and output D becomes high. As a result, after this time, the output F is low. In other words, as illustrated in FIG. 5a, when three output data X, Y and Z are changed from the same state, the respective skew times may be measured based on the timing of the state transitions of the outputs of the SR flip flops 40-1, 40-2, ..., 40-(n/3).

Figure 5B:
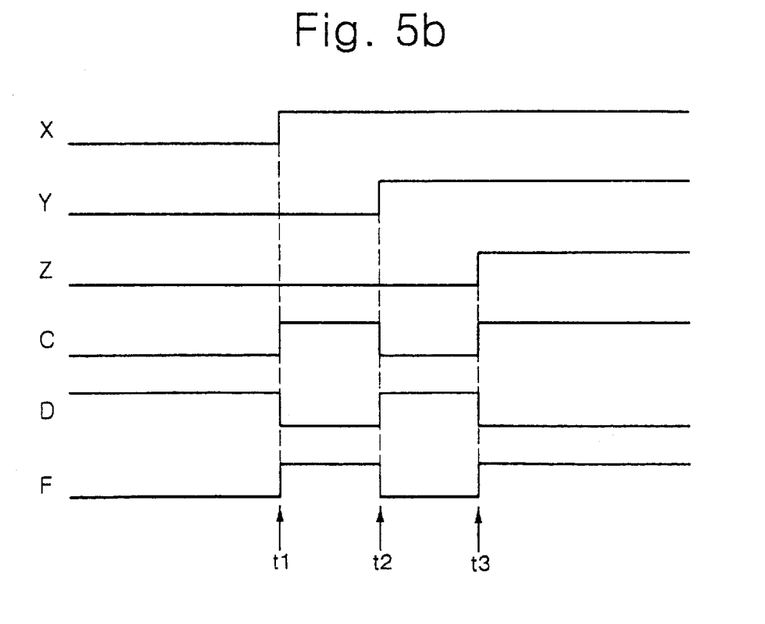

FIG. 5b illustrates output states where the data X, Y and Z output from the three data input/output pins are all changed from low levels to high levels with data X transitioning before Y and Y before Z. As shown in FIG. 5b, initially, the output C of the XOR gate 42-1 is low and the output D of the XNOR gate 44-1 is high as the data X, Y and Z are all low up to time $t_1$. As a result, the output F of the SR flip flop 40-1 is initially low. From time $t_1$ to time $t_2$ while the data X is high but Y and Z are low, the output C becomes high and the output D becomes low. Therefore, during this time, the output F is high. From time $t_2$ to time $t_3$ while the data X and Y are high but Z is still low, the output C becomes low and the output D becomes high. Therefore, during this time, the output F is low. Finally, after time $t_3$, data Z also becomes high and output C becomes high and output D becomes low. As a result, after this, time, the output F is high.

Figure 5C:
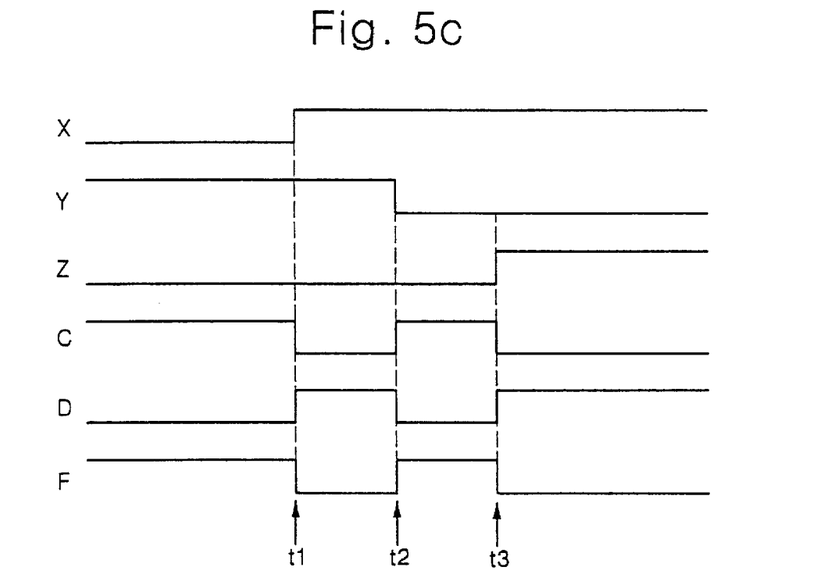

FIG. 5c illustrates output states where the data X and Z output from the data input/output pins are changed from low levels to high levels and data Y changes from a high level to a low level. Data X transitions before Y and Y before Z. As shown in FIG. 5c, initially, the output C of the XOR gate 42-1 is high and the output D of the XNOR gate 44-1 is low as the data X and Z are low and Y is high up to time $t_1$. As a result, the output F of the SR flip flop 40-1 is initially high. From time $t_1$ to time $t_2$ while the data Z is low but X and Y are high, the output C becomes low and the output D becomes high. Therefore, during this time, the output F is low. From time $t_2$ to time $t_3$ while the data X is high but Y and Z are low, the output C becomes high and the output D becomes low. Therefore, during this time, the output F is high. Finally, after time $t_3$, data Z becomes high and output C becomes low and output D becomes high. As a result, after this time, the output F is low.

Figure 5D:
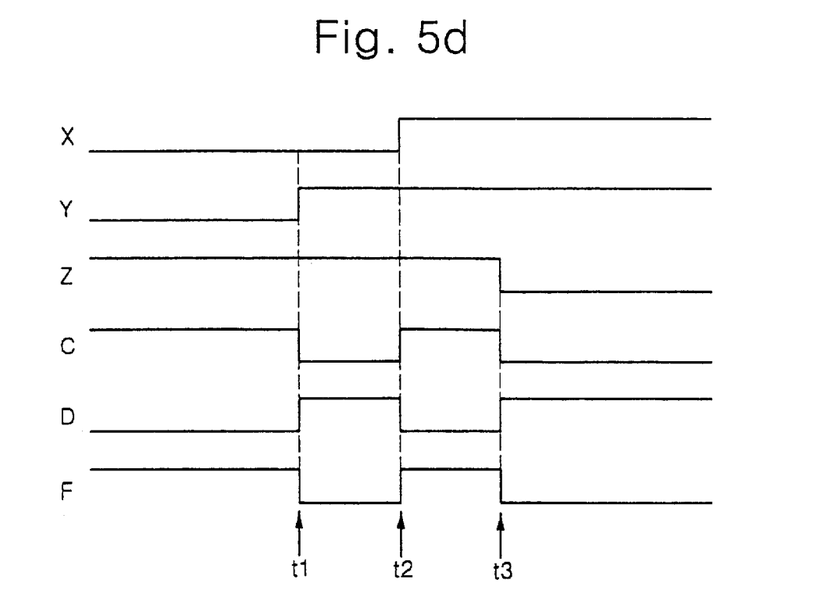

FIG. 5d illustrates output states where the data X and Y output from the data input/output pins are changed from low levels to high levels and data Z changes from a high level to a low level. Data Y transitions before X and X before Z. As shown in FIG. 5d, initially, the output C of the XOR gate 42-1 is high and the output D of the XNOR gate 44-1 is low up to time $t_1$. As a result, the output F of the SR flip flop 40-1 is initially high. From time $t_1$ to time $t_2$ while the data X is low and Y and Z are high, the output C becomes low and the output D becomes high. Therefore, during this time, the output F is low. From time $t_2$ to time $t_3$ while the data X, Y and Z are all high, the output C becomes high and the output D becomes low. Therefore, during this time, the output F is high. Finally, after time $t_3$, data Z becomes low and output C becomes low and output D becomes high. As a result, after this time, the output F is low. In other words, for the case illustrated in FIG. 5d, the same output F is provided as for FIG. 5c. It is further to be understood that, while only embodiments related to sets of two and three inputs have been described, the systems of the present invention may similarly be applies to sets of four or more data input/output pins for the measurement of skew therebetween.

Operations of the present invention have been described above with reference to the schematic block diagrams of FIGS. 2 and 4. It will be understood that each block of the block diagrams, and combinations of blocks in the block diagrams, can be implemented by special purpose hardware-based systems which perform the specified functions or steps. In other words, while various components of the comparator circuit 101 have been illustrated in FIGS. 2 and 4, in part, as discrete elements, they may, in practice, be implemented by custom or hybrid chips, by discrete components or by a combination of the above.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor device tester comprising:
   an interface that couples the semiconductor device tester to a plurality of output pins of a semiconductor device;
   a comparator circuit electrically coupled to at least two of the plurality of output pins of the semiconductor device that generates a skew signal having a duration corresponding to a time period when data on the at least two of the plurality of output pins differs;
   wherein the comparator circuit further comprises:
      a first circuit that generates an active signal when the data on the at least two of the plurality of output pins differs and an inactive signal when the data on the at least two of the plurality of output pins matches;
      a second circuit that generates an active signal when the data on the at least two of the plurality of output pins matches and an inactive signal when the data on the at least two of the plurality of output pins differs; and
      a flip flop having a set input electrically coupled to the first circuit and a reset input electrically coupled to the second circuit that outputs the skew signal.

2. A semiconductor device tester according to claim 1 further comprising a second comparator circuit electrically coupled to at least two other of the plurality of output pins of the semiconductor device and generates a skew signal having a duration corresponding to a time period when data on the at least two other of the plurality of output pins differs, the second comparator circuit further comprising:
   a third circuit that generates an active signal when the data on at least two other of the plurality of output pins differs and an inactive signal when the data on the at least two other of the plurality of output pins matches;
   a fourth circuit that generates an active signal when the data on the at least two other of the plurality of output pins matches and an inactive signal when the data on the at least two other of the plurality of output pins differs; and
   a second flip flop having a set input electrically coupled to the third circuit and a reset input electrically coupled to the fourth circuit that outputs a second skew signal.

3. A semiconductor device tester according to claim 2 wherein the first flip flop and the second flip flop are SR flip flops.

4. A semiconductor device tester according to claim 1 wherein the first circuit comprises a logical exclusive OR circuit.

5. A semiconductor device tester according to claim 4 wherein the second circuit comprises a logical exclusive NOR circuit.

6. A semiconductor device tester according to claim 5 wherein the logical exclusive OR circuit includes at least a selected number of exclusive OR gates, the selected number of exclusive OR gates being selected based on a number of the at least two of the plurality of output pins and wherein the logical exclusive NOR circuit comprises at least a selected number of exclusive NOR gates, the selected number of exclusive NOR gates being the same as the selected number of exclusive OR gates.

7. A semiconductor device tester according to claim 6 wherein the number of the at least two of the plurality of output pins is three and the selected number of exclusive OR gates is two.

8. A semiconductor device tester according to claim 6 further comprising:
   a control signal input driver circuit electrically coupled to the semiconductor device;
   a test pattern generator circuit that generates reference data responsive to the control signal input driver circuit;
   a timing generator circuit that generates a strobe;
   a signal detection circuit electrically coupled to the test pattern generator circuit and the at least two of the plurality of output pins of the semiconductor device that detects when a transition has occurred on one of the at least two of the plurality of output pins responsive to the strobe.

9. A semiconductor device tester comprising:
   an interface that couples the semiconductor device tester to a plurality of output pins of a semiconductor device;
   a comparator circuit electrically coupled to at least two of the plurality of output pins of the semiconductor device that generates a skew signal having a duration corresponding to a time period between corresponding changes of data states of the plurality of output pins; and
   wherein the device tester includes a predetermined number of comparator circuits, each of the comparator circuits electrically coupled to different ones of the plurality of output pins and generating a skew signal having a duration corresponding to a time period when data on respective coupled ones of the plurality of output pins differs.

10. A semiconductor device tester according to claim 9 wherein the interface couples all of the plurality of output pins of the semiconductor device to one of the comparator circuits.

11. A semiconductor device tester comprising:

a predetermined number of first circuits that generate an active signal when data on selected ones of a plurality of output pins of a semiconductor device differs and an inactive signal when the data on the selected ones of the plurality of output pins matches;

a predetermined number of second circuits, each of the second circuits being associated with one of the first circuits, that generate an active signal when the data on the selected ones of the plurality of output pins matches and an inactive signal when the data on the selected ones of the plurality of output pins differs; and a predetermined number of flip flops, each of the flip flops having a set input electrically coupled to an associated one of the first circuits and a reset input electrically coupled to one of the second circuits associated with the associated one of the first circuits, each of the flip flops being configured to output a skew signal having a duration corresponding to a time period when data on the associated selected ones of the plurality of output pins differs.

12. A semiconductor device tester comprising:

first signal generating means for generating on an output of the first signal generating means an active signal when data on two output pins of a semiconductor device differs and an inactive signal when the data matches;

second signal generating means for generating on an output of the second signal generating means an active signal when the data matches and an inactive signal when the data differs; and third signal generating means for generating a skew signal corresponding to a time period when the data on the two output pins differs, the third signal generating means being set responsive to the output of the first signal generating means and reset responsive to the output of the second signal generating means.

13. A semiconductor device tester according to claim 12 further comprising a plurality of first signal generating means and second signal generating means, each of the first signal generating means and second signal generating means being electrically coupled to a plurality of output pins of the semiconductor device and a corresponding plurality of third signal generating means electrically coupled to respective ones of the first signal generating means and second signal generating means.

14. A semiconductor device tester according to claim 13 wherein each of the first signal generating means and second signal generating means is electrically coupled to a different plurality of output pins of the semiconductor device.

15. A semiconductor device tester comprising:

an interface that couples the semiconductor device tester to a plurality of output pins of a semiconductor device;

a comparator circuit electrically coupled to at least two of the plurality of output pins of the semiconductor device that generates a skew signal having a duration corresponding to a time period between corresponding changes of data states of the plurality of output pins;

wherein the comparator circuit further comprises:

a first circuit that generates an active signal when the data on the at least two of the plurality of output pins differs and an inactive signal when the data on the at least two of the plurality of output pins matches;

a second circuit that generates an active signal when the data on the at least two of the plurality of output pins matches and an inactive signal when the data on the at least two of the plurality of output pins differs; and a flip flop having a set input electrically coupled to the first circuit and a reset input electrically coupled to the second circuit that outputs the skew signal.

* * * * *